United States Patent
Li et al.

(10) Patent No.: US 10,056,490 B1
(45) Date of Patent: Aug. 21, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventors: Yi-Fan Li, Tainan (TW); I-Cheng Hu, Kaohsiung (TW); Chun-Jen Chen, Tainan (TW); Tien-I Wu, Taoyuan (TW); Yu-Shu Lin, Pingtung County (TW); Chun-Yuan Wu, Yun-Lin County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/496,000

(22) Filed: Apr. 25, 2017

(30) Foreign Application Priority Data

Mar. 23, 2017 (TW) .............................. 106109701 A

(51) Int. Cl.
| | |
|---|---|
| *H01L 29/78* | (2006.01) |
| *H01L 27/088* | (2006.01) |
| *H01L 29/10* | (2006.01) |
| *H01L 21/762* | (2006.01) |
| *H01L 21/308* | (2006.01) |
| *H01L 21/3065* | (2006.01) |
| *H01L 21/8238* | (2006.01) |
| *H01L 21/8234* | (2006.01) |

(52) U.S. Cl.
CPC ...... *H01L 29/7853* (2013.01); *H01L 21/3065* (2013.01); *H01L 21/3085* (2013.01); *H01L 21/762* (2013.01); *H01L 21/76205* (2013.01); *H01L 21/76224* (2013.01); *H01L 21/823431* (2013.01); *H01L 21/823487* (2013.01); *H01L 21/823821* (2013.01); *H01L 27/0886* (2013.01); *H01L 29/1029* (2013.01); *H01L 29/7851* (2013.01)

(58) Field of Classification Search
CPC ............. H01L 21/3065; H01L 21/3085; H01L 21/823431; H01L 21/823487; H01L 21/823821; H01L 27/0886; H01L 21/762; H01L 21/76205; H01L 29/1029; H01L 29/7851; H01L 29/7853
See application file for complete search history.

(56) References Cited

U.S. PATENT DOCUMENTS

| | | | |
|---|---|---|---|
| 7,993,999 B2 | 8/2011 | Basker et al. | |
| 8,895,395 B1 | 11/2014 | Kerber et al. | |
| 9,755,019 B1 * | 9/2017 | Fung ............... | H01L 21/823814 |

(Continued)

OTHER PUBLICATIONS

Li-Wei Feng, Title of Invention: Semiconductor Device and Method of Fabricating the Same, U.S. Appl. No. 15/187,800, filed Jun. 21, 2016.

*Primary Examiner* — Fei Fei Yeung Lopez
(74) *Attorney, Agent, or Firm* — Winston Hsu

(57) ABSTRACT

A semiconductor device includes: a fin-shaped structure on a substrate, in which a sidewall of the fin-shaped structure comprises a curve. Specifically, the fin-shaped structure includes a top portion and a bottom portion, a shallow trench isolation (STI) around the bottom portion of the fin-shaped structure, and the curve includes a planar portion extending from the top surface of fin-shaped structure downward and a curved portion extending from the bottom surface of the fin-shaped structure upward.

5 Claims, 3 Drawing Sheets

(56) References Cited

U.S. PATENT DOCUMENTS

2007/0145487 A1* 6/2007 Kavalieros ........ H01L 29/66628
257/368
2012/0319211 A1* 12/2012 van Dal ............ H01L 29/66795
257/401

* cited by examiner

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly to a method for forming a curve on the sidewalls of a fin-shaped structure.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the design of fin-shaped structure in current FinFET fabrication still resides numerous bottlenecks which induces current leakage of the device and affects overall performance of the device. Hence, how to improve the current FinFET fabrication and structure has become an important task in this field.

SUMMARY OF THE INVENTION

According to an embodiment of the present invention, a method for fabricating semiconductor device includes the steps of: forming a fin-shaped structure on a substrate; forming a shallow trench isolation (STI) around the fin-shaped structure; and removing part of the fin-shaped structure so that a sidewall of the fin-shaped structure comprises a curve.

According to another aspect of the present invention, a semiconductor device includes: a fin-shaped structure on a substrate, in which a sidewall of the fin-shaped structure comprises a curve. Specifically, the fin-shaped structure includes a top portion and a bottom portion, a shallow trench isolation (STI) around the bottom portion of the fin-shaped structure, and the curve includes a planar portion extending from the top surface of fin-shaped structure downward and a curved portion extending from the bottom surface of the fin-shaped structure upward.

According to another aspect of the present invention, a semiconductor device includes: a fin-shaped structure on a substrate and an epitaxial layer around the fin-shaped structure, in which a sidewall of the epitaxial layer includes a waved surface.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
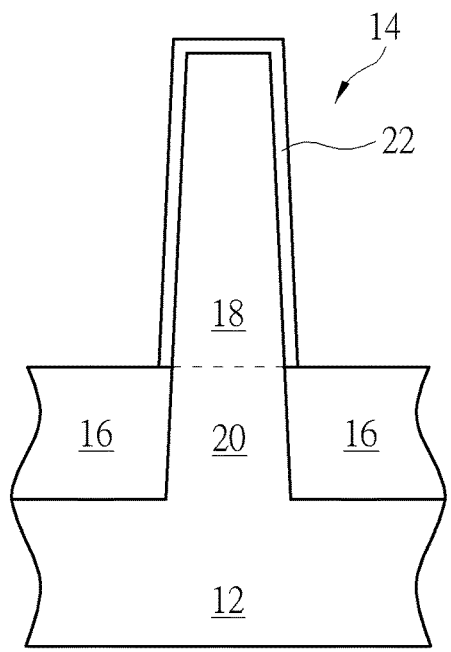
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12, such as a silicon substrate or silicon-on-insulator (SOI) substrate is provided, and at least a fin-shaped structure 14 is formed on the substrate 12.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred to the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate 12, and through an etching process, the pattern of the patterned mask is transferred to the substrate 12 to form the fin-shaped structure 14. Moreover, the formation of the fin-shaped structure 14 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 14. These approaches for forming fin-shaped structures are all within the scope of the present invention.

Next, a shallow trench isolation (STI) 16 is formed around the fin-shaped structure 14 to define the fin-shaped structure 14 into two parts, including a top portion 18 and a bottom portion 20 and the STI 16 preferably surrounds the bottom portion 20 of the fin-shaped structure 14. In this embodiment, the formation of the STI 16 could be accomplished by first conducting a flowable chemical vapor deposition (FCVD) process to form a silicon oxide layer on the substrate 12 to cover the fin-shaped structure 14 entirely, and then using a chemical mechanical polishing (CMP) process along with etching to remove part of the silicon oxide layer so that the remaining silicon oxide layer is lower than the surface of the fin-shaped structure 14 to form the STI 16.

Next, a thermal oxidation process is conducted to form a liner 22 on the substrate 22 to cover the top portion 18 of the fin-shaped structure 14, including the sidewalls and top surface of the top portion 18 entirely. In this embodiment, the liner 22 preferably includes silicon oxide, but not limited thereto.

Figure 2:
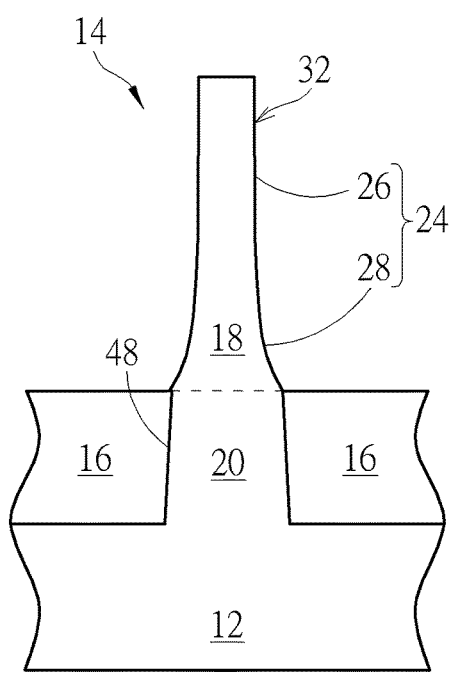

Next, as shown in FIG. 2, the liner 22 and part of the fin-shaped structure 14 are removed so that a sidewall 32 of the fin-shaped structure 14 includes a curve 24. Specifically, an etching process is conducted preferably by not forming any patterned mask to use an etchant or etching gas to remove the liner 22 completely and part of the top portion 18 of the fin-shaped structure 14. In this embodiment, the etchant or etching gas is selected from the group consisting of $CH_4$ and $CH_2F_2$ and a power used by the etching process is preferably between 300 W to 500 W.

It should be noted that since the etching target of the etching process includes both the fin-shaped structure 14 made of silicon and the liner 22 made of oxide, it would be desirable to use the above etching gas combination along with the power range provided to convert or alter the left and right sidewalls 32 of the top portion 18 into symmetrical curves 24 while removing the liner 22 entirely. Since the bottom portion 20 of the fin-shaped structure 14 is already surrounded by the STI 16, the left and right sidewalls 48 of the bottom portion 20 are not affected by the etching gas during the aforementioned etching process and the profile of the left and right sidewalls 48 preferably remained to be substantially inclined and planar sidewalls.

Viewing from a more detailed perspective, the curve 24 on each left and right sidewalls 32 includes a planar portion 26 extending from a top surface of the top portion 18 of fin-shaped structure downward and a curved portion 28 extending from a bottom surface of the top portion 18 upward.

It should be noted that since part of the fin-shaped structure 14 may be removed during the removal of the liner 22, the top surface of the remaining top portion 18 of fin-shaped structure 14 shown in FIG. 2 would be slightly lower than the top surface of the top portion 18 before the etching process.

Figure 3:
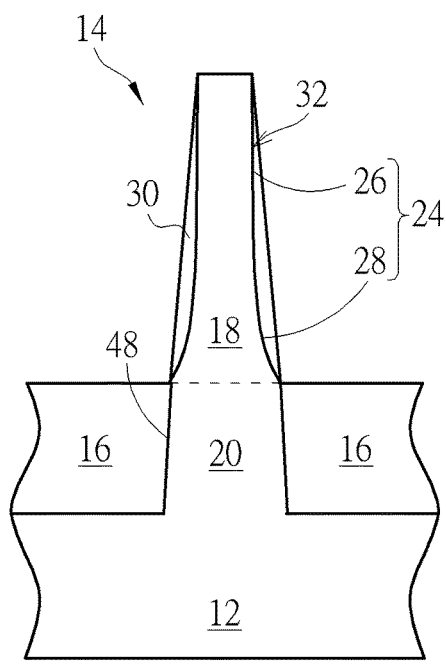
Figure 4:
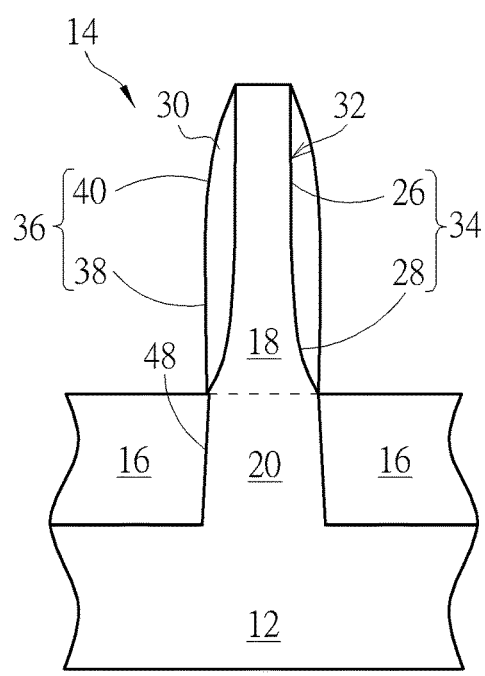

Next, as shown in FIGS. 3-4, an epitaxial growth process is conducted to form an epitaxial layer 30 on the sidewalls 32 of the fin-shaped structure 14, in which the epitaxial layer 30 preferably covers the sidewalls 32 of the top portion 18 but not the top surface of the top portion 18.

In this embodiment, the epitaxial layer 30 preferably includes silicon germanium (SiGe) and the gas injected to form the epitaxial layer 30 preferably includes two combinations. One of the gas combination used to form the epitaxial layer 30 is selected from the group consisting of dichlorosilane (DCS), $GeH_4$, and HCl, and another gas combination used to form the epitaxial layer 30 could be selected from the group consisting of dichlorosilane (DCS), $GeH_4$, and HCl. In this embodiment, other parameters controlled during the formation of the epitaxial layer 30 with either one of the above gas combinations include temperature, pressure, and concentration of germanium, in which the temperature of the process is preferably controlled between 500° C. to 700° C. or most preferably 500° C., the pressure is controlled between 10 Torr to 50 Torr or most preferably 10 Torr, and the concentration of germanium is preferably between 20% to 75%. Preferably, the thickness of the epitaxial layer 30 made of SiGe formed is between 5 Angstroms to 100 Angstroms.

It should be noted that as shown in FIG. 3, when either one of the above gas combination were injected to form an epitaxial layer 30 on the fin-shaped structure 14, the epitaxial layer 30 is first formed on the sidewalls 32 of the top portion 18 with an inclined and planar sidewall surface while no epitaxial layer 30 is formed on the topmost or top surface of the fin-shaped structure 14. After the same gas combination is injected continuously, as shown in FIG. 4, the epitaxial layer 30 would expand outwardly to form an epitaxial layer 30 having curved sidewalls. Specifically, the newly formed epitaxial layer 30 includes an inner sidewall 34 overlapping the sidewall 32 of the top portion of fin-shaped structure 14 and an outer sidewall 36 opposite to the inner sidewall 34.

In this embodiment, since the inner sidewall 34 of the epitaxial layer 30 overlaps the sidewall 32 of the fin-shaped structure 14 completely, the inner sidewall 34 of the epitaxial layer 30 also includes a planar portion 26 extending from a top surface of the top portion 18 of fin-shaped structure 14 downward and a curved portion 28 extending from a bottom surface of the top portion 18 upward. The outer sidewall 36 on the other hand includes a planar portion 38 extending from a bottom surface of the top portion 18 of fin-shaped structure 14 upward and a curved portion 40 extending from a top surface of the top portion 18 downward.

Figure 5:
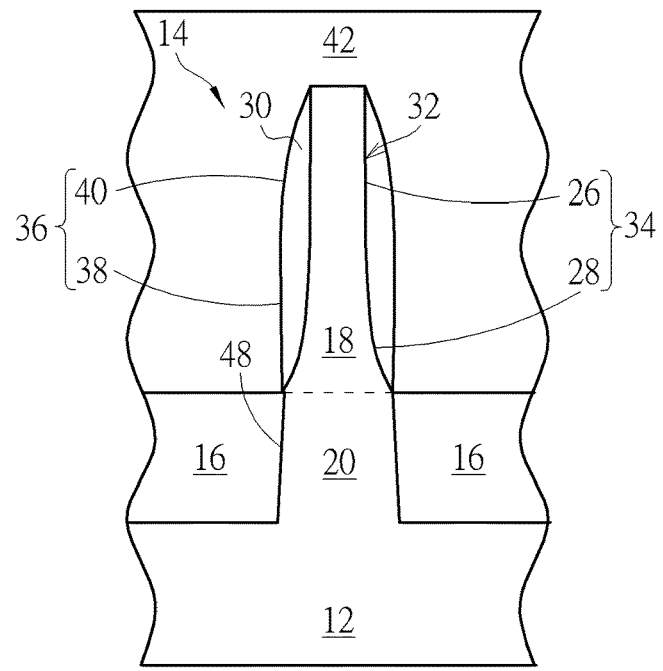

Next, as shown in FIG. 5, a FinFET process could be conducted thereafter by forming a gate structure 42 made of polysilicon on the substrate 12 and crossing the fin-shaped structure 14, forming a spacer (not shown) on the sidewalls of the gate structure 42, forming a source/drain region adjacent to two sides of the spacer, forming an interlayer dielectric (ILD) layer on the gate structure, and even performing a replacement metal gate (RMG) process to transform the gate structure into metal gate depending on the demand of the product. This completes the fabrication of a semiconductor device according to a first embodiment of the present invention.

Figure 6:
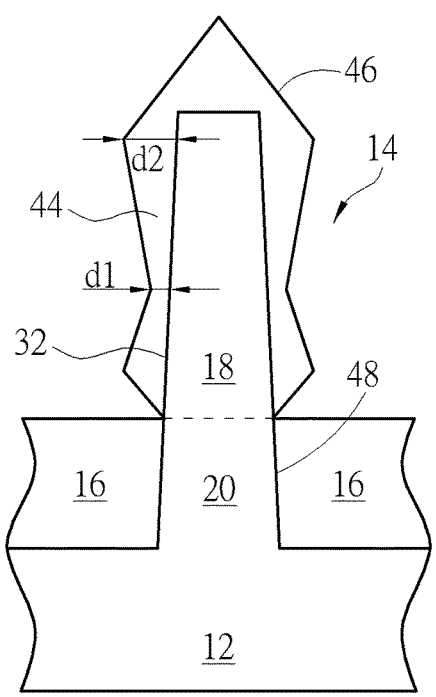
FIG. 6 illustrates a method for fabricating a semiconductor device according to a second embodiment of the present invention.

Referring to FIG. 6, FIG. 6 illustrates a method for fabricating a semiconductor device according to a second embodiment of the present invention. As shown in FIG. 6, a fin-shaped structure 14 is formed on the substrate 12 as disclosed in FIG. 1, and a STI 16 is formed around the fin-shaped structure 14 to define a top portion 18 and a bottom portion 20 while the STI 16 surrounds the bottom portion 20.

Next, the step of forming the liner 22 and the step of using etching to form curved surface on the sidewalls 32 of the top portion 18 as disclosed in FIG. 2 are omitted. Instead, an epitaxial growth process is conducted by injecting reacting gases to form an epitaxial layer 44 on the sidewalls 32 of the fin-shaped structure 14.

Similar to the aforementioned embodiment, the epitaxial layer 44 preferably includes silicon germanium (SiGe) and the gas injected to form the epitaxial layer 44 preferably includes two combinations. One of the gas combination used to form the epitaxial layer 44 is selected from the group consisting of dichlorosilane (DCS), $GeH_4$, and HCl, and another gas combination used to form the epitaxial layer 30 could be selected from the group consisting of dichlorosilane (DCS), $GeH_4$, and HCl. In this embodiment, other parameters controlled during the formation of the epitaxial layer 44 with either one of the above gas combinations include temperature, pressure, and concentration of germanium, in which the temperature of the process is preferably controlled between 500° C. to 700° C. or most preferably 500° C., the pressure is controlled between 10 Torr to 50 Torr or most preferably 10 Torr, and the concentration of germanium is preferably between 20% to 75%. Preferably, the thickness of the epitaxial layer 44 made of SiGe formed is between 5 Angstroms to 100 Angstroms.

It should be noted that even though the epitaxial layer 44 in this embodiment is also formed on the sidewalls 32 of the top portion 18 of fin-shaped structure 14, the epitaxial layer 44 is formed with a substantially waved profile or waved surface 46 since the sidewalls 32 of the top portion 18 of the fin-shaped structure 14 do not have a curved surface 24 as in the above embodiment.

Specifically, the sidewalls 32 of the top portion 18 of fin-shaped structure 14 in this embodiment includes an inclined and planar surface, and the epitaxial layer 44 is disposed around the sidewalls 32 and top surface of the top portion 18, in which the overall thickness of the epitaxial layer 44 is about 10 Angstroms to 200 Angstroms. Preferably, the thickest portion and the thinnest portion of the epitaxial layer 44 is between 5 Angstroms to 100 Angstroms. For instance, a distance d1 of the thinnest portion of epitaxial layer 44 as shown in FIG. 6 is about 10 Angstroms and a distance d2 of the thickest portion is about 50 Angstroms.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a fin-shaped structure on a substrate, wherein the fin-shaped structure comprises a top portion and a bottom portion; and
   a shallow trench isolation (STI) around the bottom portion of the fin-shaped structure, wherein a sidewall of the top portion comprises a curve and the curve further comprises:
   a first planar portion extending from a top surface of the fin-shaped structure downward and directly contacting a top surface of the top portion; and
   a first curved portion extending from a bottom surface of the fin-shaped structure upward;
   an epitaxial layer around the top portion of the fin-shaped structure while a top surface of the fin-shaped structure is exposed, wherein the epitaxial layer comprises an inner sidewall overlapping the sidewall of the fin-shaped structure and an outer sidewall opposite to the inner sidewall, wherein the outer sidewall comprises:
   a second planar portion extending from the bottom surface of the fin-shaped structure upward; and
   a second curved portion extending from the top surface of the fin-shaped structure downward.

2. A semiconductor device, comprising:
   a fin-shaped structure on a substrate; and
   an epitaxial layer around the fin-shaped structure, wherein an inner sidewall of the epitaxial layer surrounds a sidewall and a top surface of the fin-shaped structure an outer sidewall of the epitaxial layer comprises a waved surface, and the outer sidewall of the epitaxial layer comprises a V-shape having two edges converging toward a sidewall of the fin-shaped structure.

3. The semiconductor device of claim 2, wherein the fin-shaped structure comprises a top portion and a bottom portion, the semiconductor device further comprising:
   a shallow trench isolation (STI) around the bottom portion of the fin-shaped structure.

4. The semiconductor device of claim 3, wherein the epitaxial layer is around the sidewall and a top surface of the top portion of the fin-shaped structure.

5. The semiconductor device of claim 3, wherein a sidewall of the top portion of the fin-shaped structure comprises a planar surface.

* * * * *